United States Patent [19]
Kanai

[11] Patent Number: 4,914,052
[45] Date of Patent: Apr. 3, 1990

[54] PROCESS FOR THE FORMATION OF A FUNCTIONAL DEPOSITED FILM CONTAINING GROUPS III AND V ATOMS BY MICROWAVE PLASMA CHEMICAL VAPOR DEPOSITION PROCESS

[75] Inventor: Masahiro Kanai, Tokyo, Japan

[73] Assignee: Canon Kabushiki Kaisha, Tokyo, Japan

[21] Appl. No.: 302,260

[22] Filed: Jan. 27, 1989

[30] Foreign Application Priority Data

Feb. 1, 1988 [JP] Japan ................................. 63-21801

[51] Int. Cl.$^4$ ............................................. H01L 21/20
[52] U.S. Cl. .............................. 437/81; 148/DIG. 45; 148/DIG. 65; 427/39; 437/5; 437/170; 437/937
[58] Field of Search ................... 148/DIG. 1, DIG. 6, 148/22, 45, 64, 99, 110, 122, 153, 169; 156/610–614; 427/38, 39; 437/2–5, 18, 81, 87, 101, 170–172, 914, 916, 937

[56] References Cited

U.S. PATENT DOCUMENTS

| | | | |
|---|---|---|---|
| 4,401,054 | 8/1983 | Matsuo et al. | 118/50.1 |
| 4,421,592 | 12/1983 | Shuskus et al. | 156/613 |
| 4,566,403 | 1/1986 | Fournier | 118/718 |
| 4,657,777 | 4/1987 | Hirooka et al. | 427/39 |
| 4,673,589 | 6/1987 | Standley | 427/41 |
| 4,676,195 | 6/1987 | Yasui et al. | 427/39 |
| 4,798,167 | 1/1989 | Ishihara et al. | 118/723 |
| 4,832,778 | 5/1989 | Davis et al. | 118/728 |
| 4,837,113 | 6/1989 | Luthner et al. | 427/58 |

FOREIGN PATENT DOCUMENTS 0071369 4/1983 Japan .
0063376 4/1985 Japan .
0202438 9/1986 Japan .
0276977 12/1986 Japan .
0077479 4/1987 Japan .
0116775 5/1987 Japan .
0150709 7/1987 Japan .

Primary Examiner—Brian E. Hearn
Assistant Examiner—William Bunch
Attorney, Agent, or Firm—Fitzpatrick, Cella, Harper & Scinto

[57] ABSTRACT

A process for the formation of a functional deposited film containing atoms belonging to the group III and V of the peridoical table as the main constituent atoms by introducing, into a film forming space for forming a deposited film on a substrate disposed therein, a group III compound (1) and a group IV compound (2) as the film-forming raw material and, if required, a compound (3) containing an element capable of controlling valence electrons for the deposited film as the constituent element each in a gaseous state, or in a state where at least one of such compounds is previously activated in an activation space disposed separately from the film forming space, while forming hydrogen atoms in excited state which cause chemical reaction with at least one of the compounds (1), (2) and (3) in the gaseous state or in the activated state in an activation space different from the film forming space and introducing them into the film-forming space, thereby forming the functional deposited film on the substrate, wherein the hydrogen atoms in excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atom is controlled.

10 Claims, 7 Drawing Sheets

DISTANCE BETWEEN THE SUBSTRATE
AND THE METAL MESH MEMBER(mm)

ANGLE OF THE SUBSTRATE
TO THE METAL MESH MEMBER(°)

RATIO OF INCREASE IN THE DIAMETER OF THE GAS LIBERATION HOLE OF THE GAS LIBERATION RING(%)

PROCESS FOR THE FORMATION OF A FUNCTIONAL DEPOSITED FILM CONTAINING GROUPS III AND V ATOMS BY MICROWAVE PLASMA CHEMICAL VAPOR DEPOSITION PROCESS

FIELD OF THE INVENTION

The present invention relates to an improved process for forming a functional deposited film containing group III and V atoms as the main constituent atoms (hereinafter referred to as "group III-V deposited film), which is usable especially as a photoconductive member for semiconductor devices, photosensitive devices for use in electrophotography, image input line sensors, image pickup devices, photoelectromotive force devices or the like.

More specifically, the present invention relates to a process for efficiently forming said group III-V deposited film on a substrate by forming hydrogen atoms in excited state by using a hydrogen gas or a gas mixture composed of a hydrogen gas and a rare gas with microwave plasmas generated in a plasma generation chamber disposed in a cavity resonator integrated with two impedance matching circuits in a microwave circuit and bringing said hydrogen atoms in excited state into contact with a film-forming raw material gas or a separately activated film-forming raw material gas in a film forming chamber and thereby causing chemical reactions among them while controlling the excited state of the hydrogen atoms.

BACKGROUND OF THE INVENTION

For the formation of a functional deposited film, particularly a semiconductor deposited film, there has been employed a suitable film-forming process with due regards to electrical and physical properties required therefor and also to its application use.

For example, there have been attempted plasma CVD process, reactive sputtering process, ion plating process, light CVD process, thermal-induced CVD process, MO CVD process, MBE process, etc. and several of which have been employed and put to industrial use as being suitable for the formation of a desired semiconductor device.

However, even in the case of the plasma CVD process which has been employed most popularly, the electrical and physical properties of a resulting deposited film are not said quite satisfactory in view of the preparation of a desired semiconductor device and it sometime lacks in the plasma stability and reproducibility upon forming the deposited film and in addition, it may sometime cause a remarkable reduction in the yield.

For overcoming these problems, there has been proposed, for example, by Japanese Patent Laid-Open Sho 61-189649 and Sho 61-189650, a process for increasing the film deposition rate thereby remarkably improving the productivity of the film upon depositing to form a group III - V semiconductor film of high quality by HR-CVD process (Hydrogen Radical Assisted CVD process).

Further, as means for forming a high density plasma efficiently by using microwaves of about 2.45 GHz, a method for arranging electromagnets around a cavity resonator thereby establishing conditions for ECR (electron cyclotron resonance) has been proposed, for example, by Japanese Patent Laid-Open Sho 55-141729 and Sho 57-133636. In addition, formation of various kinds of semiconductor thin films by utilizing high density plasma has also been reported in academic conferences, etc.

By the way, in the HR-CVD process described above, although the hydrogen atoms in excited state (hydrogen radicals) have an important role for the formation of a deposited film regarding the control of the film property and the uniformity, there has been made no sufficient study for controlling the excited state of the hydrogen atoms in a great amount and uniformly upon forming the deposited film and controlling the chemical reaction upon forming the deposited film under the control of the excited state, thereby optionally and stably controlling the property of the deposited film formed, and there are still left several problems to be solved.

On the other hand, in the microwave plasma CVD apparatus using ECR, there are several problems. That is: the pressure in a plasma generation chamber has to be kept to less than about $10^{-3}$ Torr for establishing ECR conditions, thus undergoing restriction for the pressure upon forming the deposited film: the mean free path of gaseous molecules is increased ($\sim 1$ m) under such a level of pressure, by which the film-forming raw material gas is diffused near the microwave introduction window, decomposed and reacted to thereby cause adherence of the deposited film to the microwave introduction window or to the inner wall of the cavity resonator, thereby making electric discharge instable: and the film adhered to the substrate is contaminated by the defoliation and the scattering of the adhered film. Further, it has also been pointed out several problems. That is, a plasma generated in the plasma generation chamber is diversed along the diversing magnetic field of the electromagnets into the film forming chamber, by which the substrate is exposed to the plasma at relatively high density. Accordingly, the formed deposited film is liable to be damaged by charged particles, etc. and this causes limitation in the improvement of properties of a film to be formed. In the step of laminating a plurality of deposited films in the process of preparing a semiconductor device, the boundary characteristic is apt to reduce because of damages caused by the charged particles, etc., and this makes it difficult to improve the characteristics of the semiconductor device.

SUMMARY OF THE INVENTION

The principal object of the present invention is to overcome the foregoing problems in the prior art process for forming deposited films and provide a process for forming a functional deposited film comprising atoms belonging to the groups III and V of the periodical table as the main constituent atoms, over a large area, with satisfactory uniformity, stably and at good reproducibility, which is effective for preparing a semiconductor device of high quality.

Another object of the present invention is to provide a process for the formation of a functional deposited film containing atoms belonging to the groups III and V of the periodical table as the main constituent atoms by introducing, into a film forming space containing a substrate disposed therein on which a film is to be deposited, a film-forming raw material gas or the raw material gas previously activated by using activating energy in an activation space disposed separately from the film forming space, while forming hydrogen atoms in excited state, which cause chemical reaction with the film-forming raw material gas or the raw material gas in activated state, from a hydrogen gas or a gas mixture composed of a hydrogen gas and a rare gas in an activation space different from the film forming space by means of microwave energy as the activating energy, introducing the thus formed hydrogen atoms in excited state into the film-forming space and bringing them into contact with the film-forming raw material gas or the activated film-forming raw material gas to cause chemical reactions among them, thereby forming a desired deposited film on the substrate maintained at a predetermined temperature, wherein the hydrogen atoms in excited state are formed by means of a microwave plasma generated in a plasma generation chamber disposed in a cavity resonator integrated with two impedance matching circuits in a microwave circuit and the excited state of the hydrogen atoms is controlled.

According to the process of the present invention, a functional deposited film comprising group III and V atoms of the periodical table (hereinafter simply referred to as the group III and V element) and having uniform film quality, uniform film thickness and various excellent properties at high film quality can be formed at a remarkably improved film forming rate, stably, with good reproducibility and efficiently.

Further, according to the process of the present invention, the productivity for forming the functional deposited film can be improved remarkably as compared with conventional processes and the effective mass production of the functional deposited film can be attained.

Furthermore, according to the process of the present invention, the temperature for the substrate upon forming the deposited film can be lowered as compared with that in the conventional process, as well as the film quality can be controlled easily, stably and with good reproducibility by controlling the excited state of the hydrogen atoms, the introduction amount of the film-forming raw material compounds, etc.

DETAILED DESCRIPTION OF THE INVENTION

Figure 1:
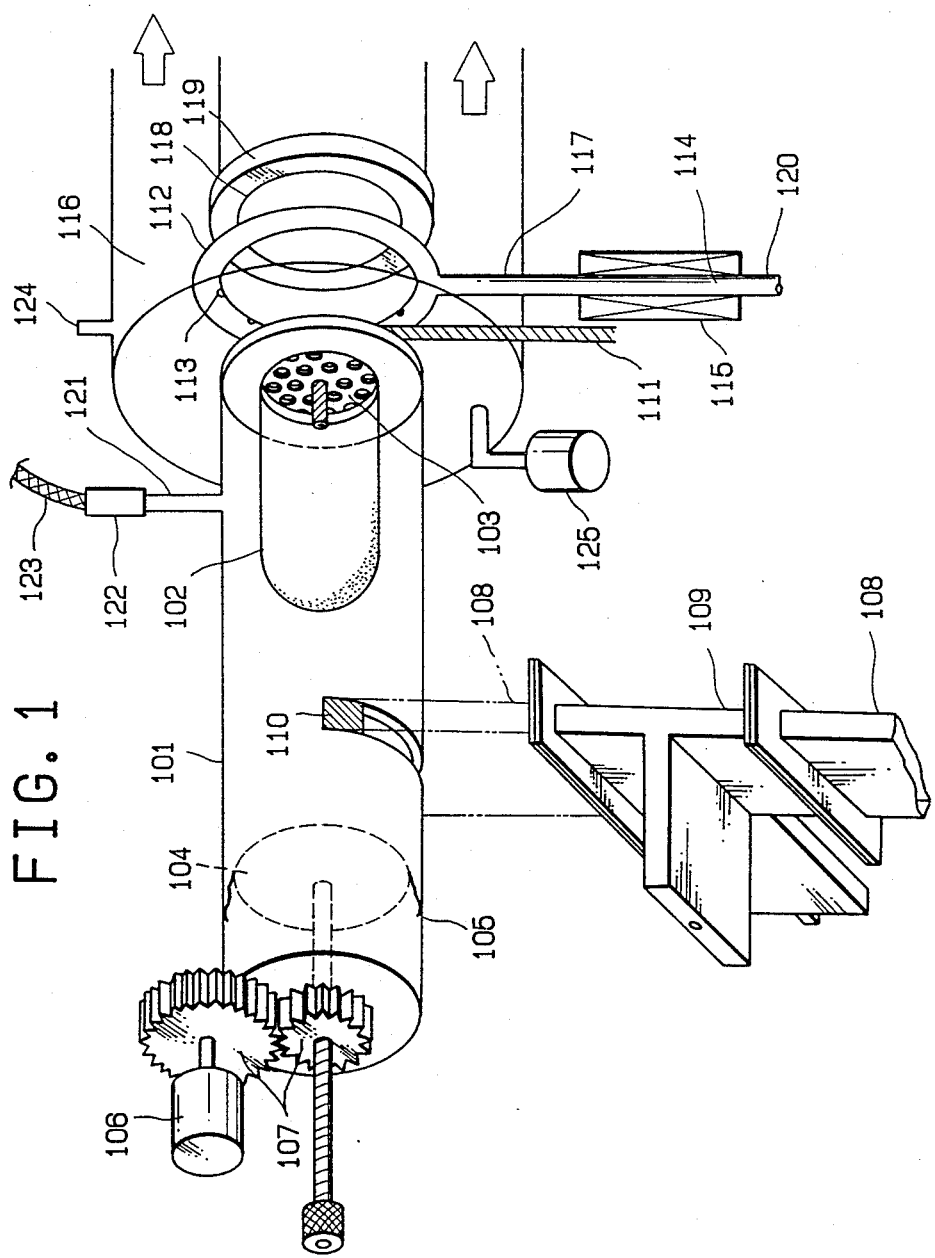
FIG. 1 is a perspective view schematically illustrating a constitutional example of the apparatus suitable for practicing the process for forming a functional deposited film by a microwave plasma CVD process according to the present invention.

The present inventor has made earnest studies for overcoming the foregoing various problems in the prior art process for forming a deposited film for attaining the objects of the present invention and, as a result, have obtained a knowledge that hydrogen atoms in optional excited state can be supplied stably, with good reproducibility and efficiently by disposing a plasma generation chamber in a cavity resonator integrated with two impedance matching circuits in a microwave circuit and conducting microwave plasma discharge by using a hydrogen gas or a gas mixture composed of a hydrogen gas and a rare gas.

The present invention has been accomplished as a result of further studies based on the above-mentioned knowledge and the feature thereof resides in a process for the formation of a deposited film by introducing, into a film forming space for forming a deposited film on a substrate disposed therein, a compound (1) and a compound (2) represented respectively by the following general formulae (I) and (II) as the film-forming raw materials and, if required, a compound (3) containing an element capable of controlling valence electrons for the deposited film as the constituent element each in a gaseous state or in a state where at least one of such compounds is previously activated in an activation space disposed separately from the film forming space, while forming hydrogen atoms in excited state which cause chemical reaction with at least one of the compounds in the gaseous state or in the activated state in an activation space different from the film forming space and introducing them into the film-forming space, thereby forming a deposited film on the substrate, wherein the hydrogen atoms in excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled:

$$R_nM_m \quad (I)$$

$$A_aB_b \quad (II)$$

where m represents a positive integer equal to or multiple integer of the valence number for R, n represents a positive integer equal to or multiple integer of the valence number for M, M represents an element belonging to the group III of the periodical table, R represents a member selected from hydrogen (H), halogen (X) and hydrocarbon group, a represents a positive integer equal to or multiple integer of the valence number for B, b represents a positive integer equal to or multiple integer of the valence number for A and A represents an element belonging to the group V of the periodical table, B represents a member selected from hydrogen (H), halogen (X) and hydrocarbon group.

Method of controlling the excited state of the hydrogen atoms is attained by measuring emission intensity of $H_\alpha$, $H_\beta$ as the excited state of hydrogen by emission spectrophotometry and controlling one or more of microwave power charged to the cavity resonator, impedance matching condition, hydrogen gas flow rate or gas mixture flow rate of the hydrogen gas and the rare gas and total pressure.

The impedance matching circuit in the cavity resonator integrated with two impedance matching circuits in the microwave circuit means restriction bodies each disposed to a cavity length varying plunger and to a junction portion between a microwave waveguide tube and a cavity resonator and the condition for the impedance matching is controlled by adjusting such restriction body.

The impedance matching circuit may be a cavity length varying plunger and an E-H tuner or a three-stub tuner.

Further, the plasma generation chamber is constituted with a metal mesh member and a microwave permeable bell jar and connected by way of the metal mesh member to the film forming space, and the hydrogen atoms in the excited state are introduced through the metal mesh member into the film forming space.

On the other hand, a substrate is disposed at an angle of 30° or less relative to the horizontal axis of the metal mesh surface and at a distance within 100 mm from the metal mesh surface. The compounds (1), (2) and (3) in the gaseous state or activated state is introduced into the film forming space by way of gas liberation means disposed between the metal mesh surface and the substrate.

The gas liberation means are disposed so as to surround, the substrate in an annular configuration, and the amount of gases liberated from each of the gas liberation apertures is made uniform, by gradually decreasing the interval of the gas liberation apertures from the side of introducing the gas liberation means toward the final liberation aperture, by gradually enlarging the size of the gas liberation aperture from the side of introducing the gas liberation means toward the final liberation aperture or by uniformly distributing the gas liberation apertures at least in the plane of the substrate and gradually enlarging the size for each of the gas liberation apertures from the side of introducing the gas liberation means toward the central portion.

When a desired functional deposited film is formed by the process for forming the deposited film according to the present invention, compounds represented respectively by the general formula (I) and (II) described above and, if required, a compound containing an element capable of controlling valence electrons for the deposited film as the constituent element, as well as hydrogen atoms controlled separately for the excited state thereof are introduced in a gaseous state or activated state into the film forming chamber to cause chemical reactions among them, thereby forming a desired semiconductor thin film containing group III and group V atoms as the main constituent atoms (hereinafter referred to as "group III-V semiconductor film") on a substrate. In this case, the crystallinity, hydrogen content, etc. of the group III-V semiconductor film can be controlled stably with good reproducibility.

The excited state of the atomic hydrogen in the present invention is determined from light emission observed in a microwave plasma of a hydrogen gas or a gas mixture of a hydrogen gas and a rare gas. Specifically, light emission from the microwave plasma is measured by emission spectrophotometry and the excited state is determined by the intensity ratio for the emission line at 656 nm belonging to $H_\alpha$ and at 486 nm belonging to $H_\beta$ among the emission lines of atomic hydrogens (H*), and at least one of the parameters concerned, i.e., the microwave power charged to the cavity resonator, the impedance matching condition, the hydrogen gas flow rate or the flow rate of the gas mixture composed of hydrogen gas and rare gas, and the total pressure is controlled so as to attain the aimed intensity ratio.

In the present invention, it is preferred to control the intensity ratio of $H_\alpha/H_\beta$ to preferably, a range of from 1/1 to 1000/1, more preferably, a range of from 10/1 to 500/1 in controlling the excited state of the hydrogen atoms.

Within the range of the intensity ratio as described above, combination of the kind and the temperature of the substrate is, particularly, a determinative factor for the film quality, etc. and a deposited film of desired film quality and property can be formed by properly combining them. Accordingly, it is necessary in the present invention to employ an emission spectrophotometer having such a sensitivity as capable of measuring the intensity ratio described above.

In the present invention, since the monitor for the microwave plasma is situated at a position, relative to the flowing direction of the total gas, to the upstream of the gas liberation means for the compounds (1), (2) and (3), no substantial deposited film is formed thereon and stable monitoring is possible from the start to the end of the film formation.

As the compounds (1) and (2) represented by the general formulae (I) and (II) respectively and also as the compound (3) containing an element capable of controlling valence electrons for the deposited film in the present invention, it is more preferred to select those spontaneously producing chemical species that cause molecular collision with the hydrogen atoms in excited state and take place chemical reaction thereby contributing to the formation of a deposited film on the substrate. If they are not desirably reactive with the hydrogen atoms in excited state or has not so high activity in the usual state of their existence, it is necessary to provide the compounds (1), (2) and (3) with such an extent of energy as not completely dissociating M and A in the general formulae from the compounds (1), (2) and (3), particularly, to excite the compounds (1) and (2) before and during film formation so that they can take place chemical reaction with the hydrogen atoms in excited state. Those compounds that can be excited to such a state that may be desirably used as the compounds (1) and (2) in the process of the present invention.

As the elements for RnMm of the compound (1) and AaBb of the compound (2) represented respectively by the general formula (I) and (II) that can be used effectively in the present invention, there can be mentioned those as described below.

Specifically, there can be mentioned those elements belonging to the group III of the periodical table, e.g., those elements belonging to group IIIA such as B, Al, Ga and In as "M". Those elements belonging to the group V of the periodical table, e.g., those elements belonging to group VA such as N, P, As and Sb as "A".

In the case of obtaining a group III-V semiconductor film by the process according to the present invention, there can be mentioned hydrides, halides, organic metal compounds, particularly, alkyl compounds, oxy compounds, etc. for each of elements belonging group III and V of the periodical table as the compounds 1 and (2).

Specifically, as the compound (1) containing the group III element, there can be mentioned: $BX_3$ (X represents halogen atom), $B_2H_6$, $B_4H_{10}$, $B_5H_9$, $B_5H_{11}$, $B_6H_{10}$, $B_6H_{12}$, $AlX_3$ (X represents halogen atom), $Al(CH_3)_2Cl$, $Al(CH_3)_3$, $Al(OCH_3)_3$, $Al(CH_3)Cl_2$, $Al(C_2H_5)_3$, $Al(OC_2H_5)_3$, $Al(CH_3)_3Cl_3$, $Al(i-C_4H_9)_3$, $Al(i-C_3H_7)_3$, $Al(C_3H_7)_3$, $Al(OC_4H_9)_3$, $GaX_3$ (X represents halogen atom), $Ga(OCH_3)_3$, $Ga(OC_2H_5)_3$, $Ga(OC_3H_7)_3$, $Ga(OC_4H_9)_3$, $Ga(CH_3)_3$, $Ga_2H_6$, $GaH(C_2H_5)_2$, $Ga(OC_2H_5)(C_2H_5)_2$, $In(CH_3)_3$, $In(C_3H_7)_3$, $In(C_4H_9)_3$, etc.

As the compound (2) containing the group V element, there can be mentioned: $NH_3$, $HN_3$, $N_2H_5N_3$, $N_2H_4$, $NH_4N_3$, $PX_3$ (X represents halogen atom), $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $P(SCN)_3$, $P_2H_4$, $PH_3$, $AsX_3$ (X represents halogen atom), $AsH_3$, $As(OCH_3)_3$, $As(OC_2H_5)_3$, $As(OC_3H_7)_3$, $As(OC_4H_9)_3$, $As(CH_3)_3$, $As(CH_3)_3$, $As(C_2H_5)_3$, $As(C_6H_5)_3$, $SbX_3$ (X represents halogen atom), $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, $Sb(C_4H_9)_3$, etc, wherein the "X" represents a halogen atom, specifically, F, Cl, Br or I.

The above raw material can be used alone, or two or more of them may be used in admixture.

As the compound (3) containing an element for controlling valence electrons for a resulting group III-V semiconductor film in accordance with the process of the present invention, it is preferred to select such a compound which is gaseous under normal temperature and normal pressure, or at least gaseous under the deposited film forming conditions, and easily gasifiable by an appropriate gasifying device.

As the compound (3) used in the present invention, in the case of obtaining a group III-V semiconductor film, there can be mentioned, for example, those compounds containing one or more of elements selected from those belonging to the groups II, IV and VI of the periodical table as effective material.

Specifically as the compound ontaining group II element, there can be mentioned: $Zn(CH_3)_2$, $Zn(C_2H_5)_2$, $Zn(OCH_3)_2$, $Zn(OC_2H_5)_2$, $Cd(CH_3)_2$, $Cd(C_2H_5)_2$, $Cd(C_3H_7)_2$, $Cd(C_4H_9)_2$, $Hg(CH_3)_2$, $Hg(C_2H_5)_2$, $Hg(C_6H_5)_2$, $Hg[C=(C_6H_5)]_2$, etc.

There can be mentioned as the compound containing group VI element: NO, $N_2O$, $CO_2$, CO, $H_2S$, $SCl_2$, $S_2Cl_2$, $SOCl_2$, $SeH_2$, $SeCl_2$, $Se_2Br_2$, $Se(CH_3)_2$, $Se(C_2H_5)_2$, $TeH_2$, $Te(CH_3)_2$, $Te(C_2H_5)_2$, etc.

These starting materials may be used alone or in a combination of two or more of them.

As the compound containing silicon which is a compound containing group IV element, there can be mentioned specifically a linear silane or silicon halide represented by the formula: $Si_uY_{2u+2}$, where u represents an integer of 1 or greater and Y represents at least one element selected from F, Cl, Br and I: a cyclic silane or silicon halide represented by the formula: $Si_vY_{2v}$, where v represents an integer of 3 or greater and Y has the same meanings as described above: and a linear or cyclic silicon compound or an organic silicon compound having alkyl group, etc. represented by the formula: $Si_uH_xY_y$, where u and Y have the same meanings as described above and $x+y=2u$ or $2u+2$.

As the compound containing germanium, there can be mentioned, for example, a linear germane or germanium halide represented by the formula: $Ge_uY_{2u+2}$, where u represents an integer of 1 or greater and Y represents at least one element selected from F, Cl, Br and I: a cyclic germane or germanium halide represented by the formula: $Ge_vY_{2v}$, where v represents an integer of 3 or greater and Y has the same meanings as described above: and a linear or cyclic germanium compound and organic germanium compound having alkyl group, etc. represented by the formula: $C_uH_xY_y$, where u and Y have the same meanings as described above and $x+y=2u$ or $2u+2$.

Further, as the compounds containing carbon, there can be used those linear or cyclic hydrocarbon compounds in which hydrogen atoms are partially or entirely substituted with halogen atoms, for example, a linear carbon halide represented by the formula: $C_uY_{2u+2}$, where u represents an integer of 1 or greater and Y represents at least one element selected from H, F, Cl, Br and I: a cyclic carbon halide represented by the formula: $C_vY_{2v}$, where v represents an integer of 3 or greater and Y has the same meanings as described above: and a linear or cyclic carbon compound represented by the formula: $C_uH_xY_y$, where u and Y have the same meaning as described above and $x+y=2u$ or $2u+2$.

Furthermore, as the compound containing tin, there can be mentioned: $SnH_4$, $SnCl_4$, $SnBr_4$, $Sn(CH_3)_4$, $Sn(C_2H_5)_4$, $Sn(C_3H_7)_4$, $Sn(C_4H_9)_4$, $Sn(OCH_3)_4$, $Sn(OC_2H_5)_4$, $Sn(i-OC_3H_7)_4$, $Sn(t-OC_4H_9)_4$ etc.

As the compound containing lead, there can be mentioned $Pb(CH_3)_4$, $Pb(C_2H_5)_4$, $Pb(C_4H_9)_4$, etc.

The raw materials described above may be used alone, or two or more of them may be used in admixture.

In the case where the gaseous raw material described above is gaseous under normal temperature and normal pressure, its amount to be introduced into the film forming space or the activation space is controlled by a mass flow controller, etc. In the case where the material is liquid, it is gasified by using a rare gas such as Ar or He or gaseous hydrogen as a carrier gas and, as required, by using a bubbler capable of temperature control. In the case where the material is in a solid state, it is gasified by using a rare gas such as Ar or He or gaseous hydrogen as a carrier gas and using a heat sublimation furnace, and its amount to be introduced is controlled mainly by control for the carrier gas flow rate and the temperature.

The hydrogen atoms in excited state used in the present invention are introduced into the film forming space simultaneously with the formation of the deposited film in the space and chemically react with the compounds (1) and (2) containing the elements to be the main constituent for a deposited film to be formed and/or the compound (1) in excited state and/or the compound (2) in excited state. As a result, a group III-V semiconductor film having desired functions is formed on a substrate at a lower substrate temperature and more easily as compared with the usual case.

For previously activating the compounds (1), (2) and (3) in the activation space disposed separately from the film forming space, activation energy such as of heat, light and electric discharge can be mentioned as the energy source that is applied to the activation space.

Specifically, there can be mentioned heat energy by ohmic heating, infrared heating, etc., light energy such as of laser beams, mercury lamp rays, halogen lamp rays, etc. and electric discharge energy such as of microwaves, RF, low frequency and DC. Such activation energy may be applied in the activation space alone or in combination of two or more of them. For effectively utilizing the effect of the activation energy, the catalytic effect may also be used in combination.

In the present invention, a hydrogen gas or a gas mixture composed of a hydrogen gas and a rare gas is used for forming the hydrogen atoms in excited state. If a microwave plasma can not be stabilized or the plasma is not generated only by means of gaseous hydrogen, it is effective to properly mix rare gas.

As the rare gas used in the present invention, there can be preferably mentioned He, Ne, Ar, Kr, Xe and Rn.

Next, explanation will be made for the method of forming a microwave plasma having a cavity resonator structure integrated with two impedance matching circuits in a microwave circuit used in the present invention.

Figure 7:
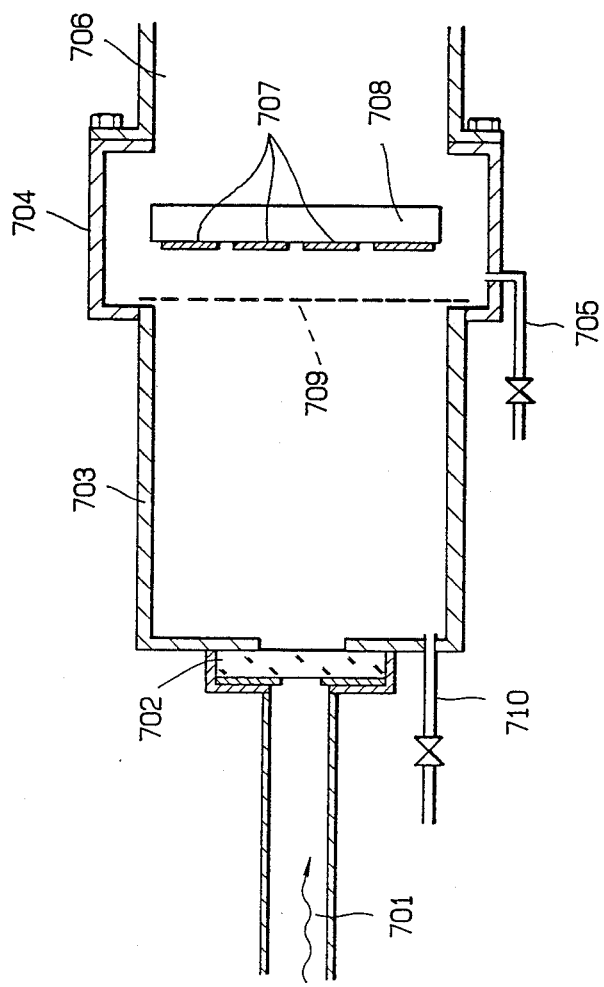
FIG. 7 is a schematic cross sectional view for the constitution of a conventional microwave plasma CVD device.

For the comparison, the method of forming a microwave plasma used so far is to be explained at first. FIG. 7 shows a schematic cross sectional view for the constitution of the known microwave CVD apparatus.

In FIG. 7, there are shown a rectangular waveguide tube 701, a microwave introducing window 702, a plasma generation chamber 703, a film forming chamber 704, gas supply pipes 705, 710, an exhaust port 706, objects 707 to be processed, an object holder 708 and a metal mesh member 709 respectively.

As shown in FIG. 7, the apparatus comprises a plasma generation chamber 703 and a film forming chamber 704 by plasma, in which the plasma forming chamber 703 and the film forming chamber 704 are partitioned by a metal mesh member 709 and permeation thereof is controlled so that microwave and charged particles are not introduced directly into the film forming chamber 704. The plasma generation chamber 703 has a structure as a cavity resonator, and the microwave propagated through a rectangular waveguide tube 701 is introduced into the plasma generation chamber 703 by way of a microwave introducing window 702 comprising dielectric material such as quartz ($SiO_2$), aluminum ceramics ($Al_2O_3$), teflon, etc. Objects 707 to be processed are disposed in the film forming chamber 704, which is provided with a gas supply pipe 705 and an exhaust port 706 for evacuating the plasma generation chamber 703 and the film forming chamber 704.

Upon actuating the microwave plasma generation device having thus been constituted, the microwave is introduced from the rectangular waveguide tube 701 into the plasma generation chamber 703, and hydrogen gas, etc. introduced through the gas introduction port 710 is converted into a plasma by the electric field energy of the microwave to form a great amount of hydrogen atoms in excited state. The hydrogen atoms in excited state are introduced through the metal mesh member 709 into the film forming chamber 704, collided against gases supplied from the gas introduction pipe 705 and cause chemical reaction thereby capable of forming a deposited film on the objects 707 to be processed.

However, in the case of using the conventional microwave plasma generation device having the aforementioned constitution, if the rectangular waveguide tube 701 is clamped with the plasma generation chamber 703 as the cavity resonator, since the input impedance is not matched, there is a problem that most of the electric field energy of the microwave is reflected, failing to effectively utilize the energy.

As one of the countermeasures for the problem, there has been employed a method of arranging electromagnets around the cavity resonator to attain ECR (Electron Cyclotron Resonance) (refer to Japanese Patent Laid-Open Sho 55-141729). However, since a magnetic flux density as high as 875 gauss is required in this method, the device is rather large in the size and heavy in the weight. Further, since the chamber is so designed that it usually constitutes a cavity resonator in vacuum, if a plasma is generated by electric discharge, since the refractive index of the plasma is smaller than 1, it no more functions as the cavity resonator (refer to "Discharge Handbook" edited by Electric Society, Part 4, Chapter 2, 298p). In addition, in the case of forming a static magnetic field by the electromagnets, since electric current changes under heating by the coiled wire member, not only a considerable time is required for stably preparing ECR conditions (that is, magnetic flux density as high as 875 gauss) while suppressing such change, but also there is a problem that if it goes out of the ECR conditions, the absorption rate of the microwave is reduced and the improvement in the efficiency for utilizing the electric field is difficult till it is stabilized.

Accordingly, in the present invention, it has been found effective as the means for overcoming the foregoing problems to constitute such a structure that can operate as a cavity resonator irrespective of the presence or absence or the density of a plasma and to dispose a bell jar as the plasma generation chamber in the cavity resonator for exciting a TM mode.

Specifically, in the cavity resonator structure, a cavity length varying plunger is disposed and the rectangular wave guide tube and the cylindrical cavity resonator are clamped with each other such that their axes are in perpendicular with each other as shown in FIG. 1. Furthermore, for carrying out the impedance matching, it is preferred to employ either one of a restriction disposed to the junction between the rectangular waveguide tube and the cavity resonator or an E-H tuner or three-stub tuner in combination with the cavity length varying plunger.

The bell jar for forming a plasma disposed in the cavity resonator has microwave permeability and it is formed with those materials capable of keeping gas tightness, for example, so-called new ceramics such as quartz ($SiO_2$), alumina ceramics ($Al_2O_3$). boron nitride (BN), silicon nitride ($Si_3N_4$), silicon carbide (SiC), beryllia (BeO), magnesia (MeO), zirconia ($ZrO_2$), etc.

The cavity length varying plunger is disposed to the bell jar on the side of introducing the microwave, that is, on the side of the atmosphere. Accordingly, since impedance can be matched by varying the cavity length in the atmospheric air, the cavity length can be adjusted easily depending on the absence or presence of a plasma or on the change of cavity resonance conditions due to the change of the plasma density, thereby enabling to generate a microwave plasma at good reproducibility and stability.

In the present invention, the metal mesh member disposed between the bell jar and the film forming space has a function as an end face plate for establishing the conditions for the cavity resonance and, accordingly, it is desirable that the diameter of the mesh member is preferably less than λ/2 and, optimally, less than λ/4 relative to the wavelength of the microwave in the tube used.

The metal mesh member has a shape of a metal gage, a thin metal plate perforated with round or polygonal apertures, etc. and may consist of material such as so-called metal element, for example, Al, Fe, Ni, Ti, Mo, W, Pt, Au, Ag and stainless steel or glass, ceramics applied with surface treatment with the metals described above by means of plating, sputtering, vapor deposition, etc. or metal composite material.

Further, it is desirable that the diameter and the distribution of apertures of the metal mesh member are varied in order to introduce the hydrogen atoms in excited state formed in the bell jar efficiently and uniformly into the film forming space. The entire porosity is preferably, 10% or more, more preferably, 20% or more and, most preferably, 30% or more.

For attaining the uniform thickness and uniform property of a resulting deposited film to be formed on the substrate in the present invention, examinations have been made for the distance of the substrate from the metal mesh member and for the angle of the metal mesh member relative to the horizontal axes while forming also a ZnSe:H film as the group III-V semiconductor film and as a result, the following results were obtained.

Figure 3:
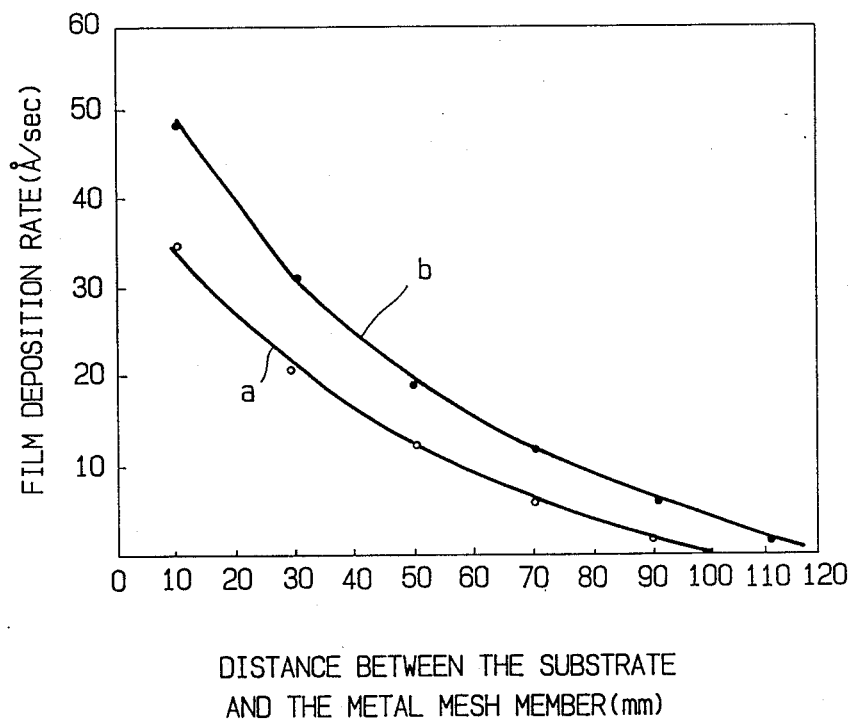
FIG. 3 is a graph illustrating a relationship of the film deposition rate to the distance between a substrate and a metal mesh member in the process for forming a deposited film by a microwave plasma CVD process according to the present invention.

FIG. 3 shows typical two examples each illustrating a relationship of the deposition rate of the deposited film formed relative to the distance between the substrate and the metal mesh member, in which the curve a comprising plotted marks "o" and the curve b comprising plotted marks "●", which were obtained respectively under the film forming conditions (A) and (B) shown in Table 1.

Figure 4:
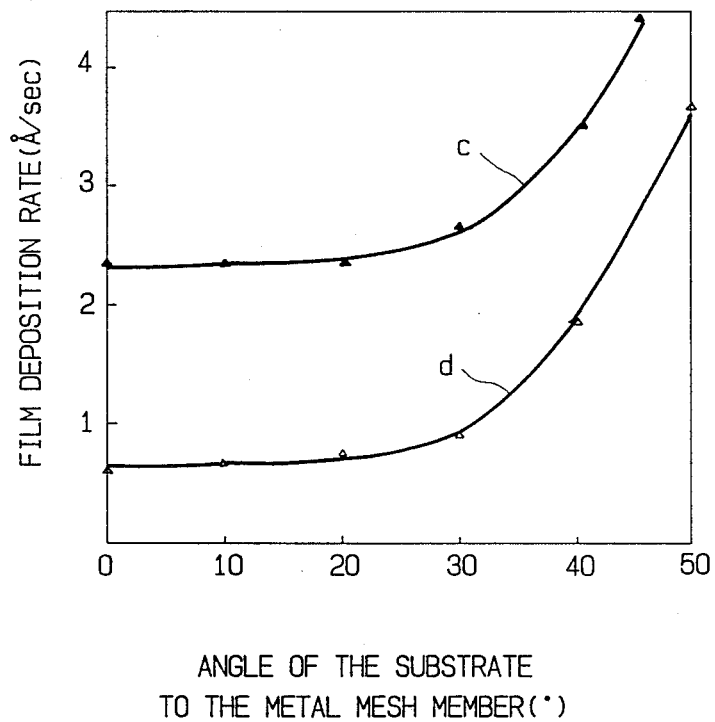
FIG. 4 is a graph illustrating a relationship of the difference in the film deposition rate in the formed deposited film relative to the angle between the substrate and the metal mesh member in the process for forming a deposited film by a microwave plasma CVD process according to the present invention.

FIG. 4 represents the film thickness distribution of the film deposited on the substrate as the difference of the deposition rate when the angle between the substrate and the metal mesh member is changed in the cases where the distance between the substrate and the metal mesh member is 30 mm (curve c plotted by "▲") and 70 mm (curve d, plotted by "△") under the film forming conditions (A).

As can be seen from FIG. 3, the deposition rate tends to decrease rapidly as the distance between the substrate and the metal mesh member is increased. Particularly, under the film forming condition (A), formation of the deposited film is scarcely observed if the distance exceeds 100 mm. Also in the film forming condition (B), the deposited film formed at the distance in excess of 100 mm has poor characteristic and is not suitable to practical use. In addition, from FIG. 4, it has been found that the distribution of the film thickness is rapidly increased if the angle between the substrate and the metal mesh member exceeds 30 degree in all of the positions for the substrate and, in relation therewith, the distribution of the film property is also increased to remarkably decrease the uniformity.

TABLE 1

| Item | Film forming condition | (A) | (B) |
|---|---|---|---|
| Substrate temperature | | | 230° C. |
| Compound (1)* | | Ga(CH$_3$) | |
| | | He | 10 sccm |
| Compound (2) | | AsH$_3$ | 8 sccm |
| | | He | 6 sccm |
| Hydrogen atom-forming raw material gas | | H$_2$ | 15 sccm |

TABLE 1-continued

| Item | Film forming condition | (A) | (B) |
|---|---|---|---|
| | | Ar | 40 sccm |
| Pressure upon film formation | | 0.05 Torr | 0.15 Torr |
| Metal mesh member | | Punched Al board (120 mmØ), 6 mm pore size, 45% porosity; uniform pore distribution | |
| Gas revelation means for the compound (1), (2) | | Annular liberation ring having 2 mmØ apertures, formed at 8 positions at an equal distance, disposed apart by 10 mm from the metal mesh member | |
| Microwave charging power | | 250 W | 300 W |

*Compounds (1) was gasified with He as the carried gas and introduced into the film forming space.

The same examinations as described above were also conducted upon forming other group III-V element semiconductor thin films under several conditions and substantially the same results were obtained in each of the cases.

Accordingly, in the present invention, it is defined that the distance between the substrate and the metal mesh member is preferably, 100 mm or less, more preferably, 70 mm or less, and the angle between the substrate and the horizontal axis of the metal mesh member is preferably, 30 degree or less and, more preferably, 20 degree or less, as necessary conditions in order to keep the uniformity for the distribution and the property of the film thickness and the film property within ±5%.

In addition, further examinations have been conducted on the gas liberation means for the compound (1), (2) and, if required, the compound (3) in the present invention in order to improve the uniformity of the film thickness distribution and the film property.

The range of pressure preferably used in the present invention is in an intermediate flow region situated between a viscosity flow and a molecular flow referred to in the fluid technology, for which the conductance calculation formula in the molecular flow region can not be used. Accordingly, in the present invention, the following experiments have been conducted while taking notice of the apertures size, distance and distribution of the gas liberation apertures disposed to the gas liberation means, to obtain the results as shown in FIG. 5 and FIG. 6.

Figure 2A:
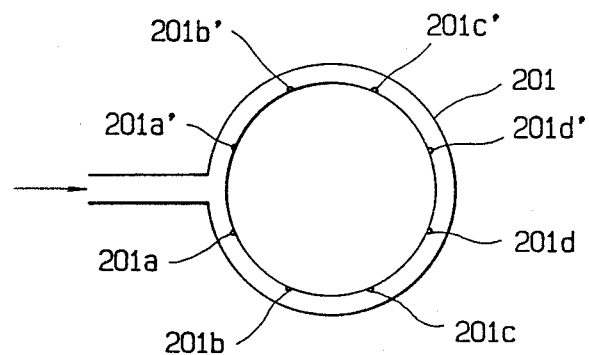
FIG. 2(a), FIG. 2(b) and FIG. 2(c) are, respectively, schematic explanatory views of gas liberation rings to be employed in the apparatus shown in FIG. 1.
Figure 5:
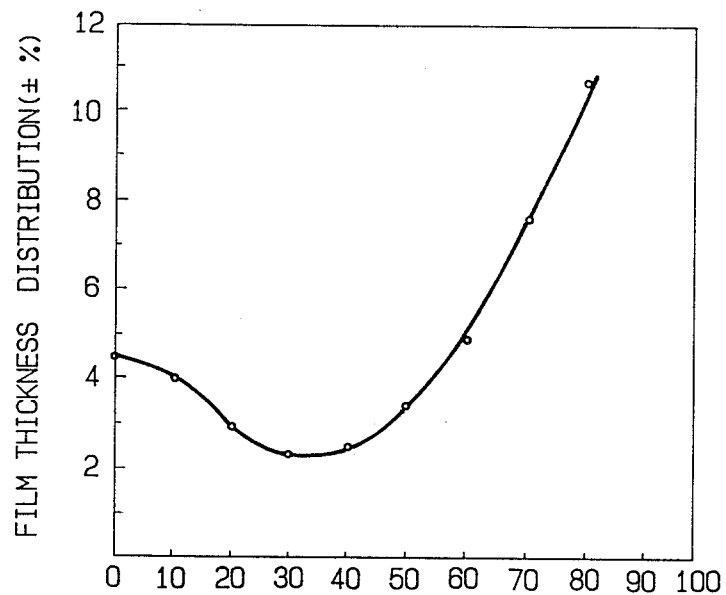
FIG. 5 is a graph illustrating a relationship of the film thickness distribution in a deposited film formed relative to the increasing rate of the diameter for the gas liberation apertures of the gas liberation rings illustrated in FIG. 2(a) through FIG. 2(c) in the apparatus used upon practicing the microwave plasma CVD process according to the present invention.
Figure 6:
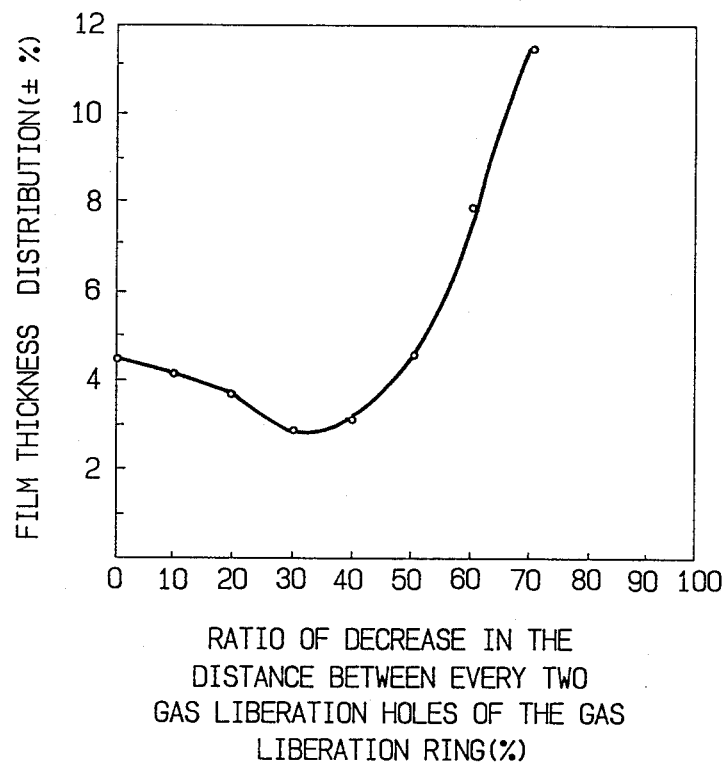
FIG. 6 is a graph illustrating a relationship of the film thickness distribution in the deposited film formed relative to the decreasing rate of the interval for the gas liberation apertures of the gas liberation rings illustrated in FIG. 2(a) through FIG. 2(c) in the apparatus used upon practicing the microwave plasma CVD process according to the present invention.

FIG. 5 illustrates the results obtained by forming a deposited film under the film forming conditions (A) shown in Table 1, by setting the substrate at a distance of 30 mm and using the gas liberation ring 201 shown in FIG. 2(a).

In the gas liberation ring 201 shown in FIG. 2(a), eight liberation apertures 201a-201d, 201a'-201d' are apertured each at an equal distance, in which the aperture diameter is gradually increased from the liberation apertures 201a, 201a' nearest in the direction of the arrow (→) toward the downstream to the apertures 201d, 201d'. FIG. 5 illustrates the change of the film thickness distribution for deposited films to be formed by using each of the gas liberation rings manufactured while varying the increasing rate for the aperture diameter from 0 to 80%.

As can be seen from the result, it is recognized that although the film thickness distribution is improved within a range for the aperture diameter increasing rate from about 0 to 40% the film thickness distribution is rather increased if it exceeds 40%, and the film thickness distribution is further increased if it exceeds 60%, than the case where the aperture diameter is unchanged (aperture diameter increasing rate 0%). The film property shows a relationship substantially correlated with the film thickness distribution. The trend is substantially the same also under other film forming conditions.

Accordingly, in the present invention, it is desirable to set the aperture diameter increasing rate to, preferably, a range of from 0 to 50% and, more preferably, a range of from 20 to 40%.

Figure 2B:
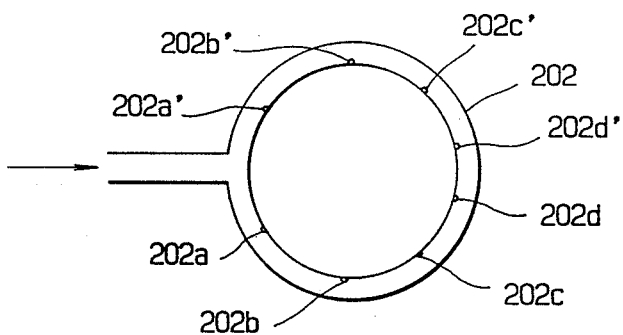

Then, FIG. 6 shows the results of the experiments conducted under the same film forming conditions as above by using the gas liberation ring 202 shown in FIG. 2(b).

In the gas liberation ring 202 shown in FIG. 2(b) eight liberation apertures 202a–202d and 202a'–202d' of an identical aperture diameter are perforated with the distance being gradually decreased with reference to the distance between the liberation apertures 202a and 202a', and the change of the film thickness distribution of the deposited film formed by using each of the gas liberation rings manufactured while varying the decreasing rate from 0 to 70% is shown in FIG. 6.

From the results, it has been recognized that while the film thickness distribution is improved within a range for the inter-aperture distance decreasing rate from 0 to 40%, the film thickness distribution is rather increased if it exceeds 40% and the film thickness distribution is further increased if it exceeds 50% than in the case where the aperture distance is unchanged (inter-aperture distance decreasing rate: 0%).

The film property shows the relationship substantially correlated with the film thickness distribution. The trend is substantially the same also under other film forming conditions.

Accordingly, in the present invention, it is desirable to set the inter-aperture distance decreasing rate to, preferably, a range of from 0 to 50% and, more preferably, a range of from 20 to 40%.

Figure 2C:
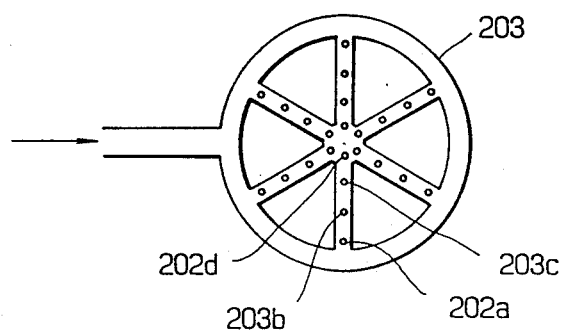

Further, the same experiments as those for determining the relationship shown in FIG. 5 were conducted by using the gas liberation ring 203 shown in FIG. 2(c). In the gas liberation ring 203 shown in FIG. 2(c), liberation apertures 203a–203d are uniformly distributed and the aperture diameter was increased in the direction from 203a to 203d. The trend in the change of the film thickness distribution and the film property obtained by using gas liberation rings having various increasing rates was substantially the same as the results shown in FIG. 5.

Accordingly, in the case of the distribution for the gas liberation apertures as shown in FIG. 2(c) in the present invention, it is desirable to set the aperture diameter increasing rate to, preferably, a range of from 0 to 40% and, more preferably, a range of from 10 to 30%.

In the present invention, the inner pressure during the film forming may properly be determined depending upon the conditions for stably forming a microwave plasma from a hydrogen gas or a gas mixture composed of a hydrogen gas and a rare gas, as well as the kind and the state selected for the compounds (1) and (2), and the compound (3), as well as desired property of the deposited films, etc. It is desirable to set the inner pressure to, preferably, a range of from 100 to $1 \times 10^{-4}$ Torr, more preferably, a range of from 10 to $5 \times 10^{-4}$ Torr and, most preferably, a range of from 1 to $1 \times 10^{-3}$ Torr.

By the method according to the present invention, a deposited film having desired crystallinity can be formed on a substrate of any crystallinity irrespective of its amorphous or crystalline property.

In the present invention, the oscillation mode in the microwave oscillator, in order to establish a stable cavity resonance condition, is a continuous oscillation mode, having a ripple in the power range used preferably within a range of 30%.

By the process according to the present invention, hydrogen atoms in excited state can be formed with good controllability, stably and with good reproducibility by a microwave plasma using a cavity resonator integrated with two impedance matching circuits in a microwave circuit, whereby the controllability for the reaction between the hydrogen atoms in excited state and the film-forming raw material can be remarkably improved, and a desired group III-V semiconductor film having desired crystallinity, hydrogen content, etc. can be formed with good uniformity, high efficiency and good reproducibility.

Description will be made for a typical embodiment of the deposited film forming apparatus suitable for practicing the process according to the present invention, but it should be noted that the present invention is not restricted only to such a deposited film forming apparatus.

FIG. 1 is a perspective view schematically illustrating the constitution of the deposited film-forming apparatus suitable for practicing the process according to the present invention.

In FIG. 1, a cylindrical cavity resonator 101 comprises a bell jar 102 as a microwave plasma generation chamber, a metal mesh member 103, a cavity length varying plunger 104, a rectangular waveguide tube 108 and a restriction 110 as the main constituent components. A spring 105 made of phosphor bronze is disposed for improving the contact between the plunger 104 and the cylindrical cavity resonator 101 to prevent abnormal electric discharge. The cavity length varying plunger 104 can be moved by a motor 106 and a speed change gear 107 toward the bell jar 102. An E-H tuner or a three-stub tuner 109 constitutes one of impedance matching circuits constituting a microwave circuit in the present invention, which is used for the impedance matching being paired with the resonance length varying plunger 104 as the other of the impedance matching circuits The restriction 110 constitutes one of the impedance circuits in the same manner and it is used being paired with the cavity length varying plunger 104.

Restrictions 110 are disposed in a pair on the right and left the junction between the rectangular waveguide tube 108 and the cylindrical cavity resonator 101 and so adapted that they can be moved slindingly along the cylindrical surface of the rectangular waveguide tube 108 in the longitudinal direction independent of each other and kept in contact with the cylindrical cavity resonator 101 by means of springs made of phosphor bronze not illustrated.

A liberation aperture for a hydrogen gas or a gas mixture of a hydrogen gas and a rare gas from a gas introduction pipe 111 is passed through the metal mesh member and directed to the inside of the bell jar 102. Hydrogen gas, etc. introduced into the bell jar 102 is converted into a plasma by microwaves charged into the cavity resonator 101 to form hydrogen atoms, etc. in an excited state, which are then introduced through the metal mesh member 103 into the film forming space 116.

The pressure in the film forming space is measured by a pressure gage 125.

In the film forming space 116, a raw material gas liberation ring 112 for forming a deposited film is disposed between a substrate 118 and a substrate holder 119.

An activation space 114 is used for previously activating the film-forming raw material as introduced from a gas supply pipe 120, if necessary, around which activating energy generation means 115 for generating energy such as heat, light, electric discharge is disposed.

In a case where the previously activated film-forming raw material gas is introduced, it is desirable that a transportation pipe 117 has such a diameter and consists of such material as capable of maintaining the activated state.

For the gas liberation ring 112, gas liberation apertures 113 of the constitution as explained in FIG. 2 are formed.

The film-forming raw material gas, etc. introduced into the film forming space 116 is evacuated in the direction of the arrow shown in the drawing by means of an evacuation pump not illustrated.

A port 121 is disposed for the monitor of a microwave plasma, to which a light gathering probe 122 is connected. The light gathering probe 122 is connected by way of a quartz fiber 123 to a spectrometer not illustrated for conducting emission spectrophotometry. Reference numeral 124 denotes a stand-by port for the monitor of the plasma on the side of the film forming space.

DESCRIPTION OF THE PREFERRED EMBODIMENTS

The process for the formation of a functional deposited film according to the present invention will be described more in detail referring to examples. It should, however, be noted that the present invention is not restricted only to these examples.

EXAMPLE 1

At first, a glass substrate 118 of 150 $\phi$ diameter (Trade name: #7059, manufactured by Coning Glass Works) was placed on the substrate holder 119 in the film forming space 116, and the pressure in the film forming space 116 was reduced to $1 \times 10^{-6}$ Torr by evacuation using an evacuation pump not illustrated. Then, the substrate holder was heated such that the surface temperature of the substrate 118 was set to 250° C. by means of a substrate temperature controller not illustrated.

When the surface temperature of the substrate was settled, a mixture of H2 gas at 30 sccm and Ar gas at 200 sccm was introduced from gas reservoirs not illustrated by way of the gas introduction pipe 111 to the quartz bell jar 102. Then, the pressure in the film forming space 116 was controlled to 0.1 Torr by using an automatic pressure controller not illustrated.

Then, microwave was charged from a continuous oscillation type microwave oscillator not illustrated by way of the rectangular waveguide tube 108 into the cavity resonator 101. Soon after, the cavity length varying plunger 104 is operated by the motor 106 and the speed change gear 107 and adjusted to such a position that the ratio of the reflection power/incident power measured by a power monitor disposed in a microwave circuit not illustrated and further the opening degree of the restrictions 110 was adjusted to such a position to minimize the ratio of the reflection power/incident power. Then, the operations for finely adjusting the position of the cavity length varying plunger 104 and the opening degree for the restrictions 110 were repeated so that the ratio of the reflection power-incident power was minimized and the value for the effective incident power represented by incident power-reflection power was set to 320W.

At this instance, the intensity ratio of emission lines $H_\alpha/H_\beta$ from the hydrogen atoms in excited state monitored through the port 111 was 85.

The substrate 118 and the metal mesh member 103 were set at a distnce of 40 mm in parallel with each other. A punched board made of aluminum having 150 $\phi$ diameter in which apertures each of 8 $\phi$ diameter were uniformly distributed with the porosity of 50%, was used as the metal mesh member 103. The gas liberation ring 112 used had a constitution as shown in FIG. 2(a) in which the aperture diameter corresponding to 201a, 201a' was 1.5 mm and the increasing rate of aperture diameter was 30%.

Subsequently, a mixture of $Ga(CH_3)_3/Zn(CH_3)_2$ (10000:1) bubbled with He gas as a carrier gas at 25 sccm and $AsH_3$ gas at 15 sccm from a gas reservoir and bubbling device (not illustrated) were mixed and introduced through the gas supply pipe 120 and from the gas liberation ring 112 into the film forming space 116. In this case, the pressure in the film forming space 116 was controlled by an automatic pressure controller so as to be maintained at 0.1 Torr. $Zn(CH_3)_2$ also has a function as a dopant.

Soon, the hydrogen atoms in excited state, $Ga(CH_3)_3$, $Zn(CH_3)_2$ and $AsH_3$ caused chemical reactions to from a GaAs:H:Zn film of 3.7 $\mu$m film thickness on the substrate 118 for 20 min. (specimen No. 1-1).

After cooling and then taking out the substrate and replacing it with a 6 inch n+Si (100) wafer, the deposited film was formed under the same procedures as described above except for changing the H2 gas flow rate to 55 sccm, the pressure in the film forming space to 0.08 Torr and the substrate temperature to 350° C. The intensity ratio of $H_\alpha/H_\beta$ in this case was 45 (specimen No. 1-2).

When the film thickness distribution was measured and the crystallinity of the deposited film was evaluated by X-ray diffractiometry and electron ray diffractiometry (RHEED) on each of the deposited film specimens obtained, it was confirmed that the film thickness distribution was within ±3% for each of the specimens and that the specimen No. 1-1 was a polycrystalline film with the grain size of about 2.2 $\mu$m, while the specimen No. 1-2 was an epitaxial film having nearly (100) orientation at the surface in parallel with the substrate.

When a portion was cut out from each of the specimens and put to composition analysis by SIMS, each of the specimens had about 1:1 atomic composition ratio for Ga and As thus satisfying the stoichiometrical relationship, and the H content was 3.8 atomic % for the specimen No. 1-1, and 0.4 atomic % for the specimen No. 1-2.

Each of the specimens was put into a vacuum deposition device and vapor deposited with a dot Al electrode of $\phi$ 2 diameter by means of ohmic heating and, when the hole mobility ($u_h$) was measured by van der Pauw method, it was 45±1.3 cm$^2$/v.sec for the specimen No. 1-1 and 410±12 cm$^2$/v.sec for the specimen No. 1-2 within the entire surfaces and the characteristic distribution was about ±3%. Further, when the conduction type was examined by a thermovoltatic power measurement, all of them were of p-type.

From the foregoings, it has been found that the crystallinity can be controlled with ease according to the present invention.

EXAMPLE 2

Tow kinds of GeP:H:Te films were formed by the same procedures as those in Example 1 except for setting the $H_2$ gas flow rate to 40 sccm (specimen No. 2-1) and 120 sccm (specimen No. 2-2) and the microwave charging power to 200W under the conditions as described below.

A glass substrate (#7059) of 150 $\phi$ diameter was used as the substrate. A mixture of $Ga(CH_3)_3/Te(CH_3)_2$ (10000:1) bubbled with $H_2$ gas at 20 sccm, $PF_5$ at 20 sccm and were mixed and introduced into the film forming space, the pressure in the film forming space was set to 0.2 Torr and the substrate temperature was set to 250° C. The gas liberation ring, metal mesh member, substrate position etc. were identical with those in Example 1.

$H_\alpha/H_\beta$ ratio upon film formation was 190 for the specimen No. 2-1 and 110 for the specimen No. 2-2.

When each of the specimens of the deposited films thus obtained was evaluated, the results as shown in Table 2 were obtained.

Each of the properties was within a range of ±3% in the surface. From the foregoings, it has been found that the crystal grain size, hydrogen content, etc. can be controlled with ease by the present invention.

EXAMPLE 3

Deposited films were formed in the same procedures as in Example 1 except for changing the microwave charging power from 320W to 180W, and heating the activation space 114 constituted with the quartz tube disposed on the gas supply pipe 120° to 700° C. by means of the infrared heating furnace 115 as the activating energy generation means (specimen No. 3-1, No. 3-2).

When the deposited films obtained were evaluated in the same procedures, the deposition rate was increased by about 10% although the microwave charging power was reduced, and substantially the same properties as those obtained in Example 1 could be obtained as shown in Table 3.

EXAMPLES 4-6

Deposited films were formed under the same procedures and film forming condition as those in Example 2 except for changing the film-forming material compound and a portion of the film forming conditions for those shown in Table 4.

When the film property was evaluated for the deposited films obtained, the results as shown in Table 5 were obtained and all of them were of high quality having the distribution of the film thickness and the film properties within a range of ±3%.

EXAMPLE 7

A deposited film was formed under the same procedures and film forming conditions as those in Example 4 except for further introducing $Ga(CH_3)_3$, while being bubbled with He gas at 8 sccm and changing the distance between the substrate and the metal member to 50 cm.

When the composition of the thus obtained deposited film was evaluated by SIMS, it has been confirmes to be a $Al_{0.8}Ga_{0.2}As$:H:Se film. Further, H content was 2.0 atomic %.

The conduction type by a thermovoltatic power measurement was of n-type.

TABLE 2

| Specimen Item | No. 2-1 | No. 2-2 |
| --- | --- | --- |
| Crystal grain size | 0.6 μm | 1.5 μm |
| H content | 3.7 atomic % | 1.1 atomic % |
| Hole Mobility | 6 cm$^2$/v.sec | 20 cm$^2$/v.sec |
| Conduction type | p type | p type |

TABLE 3

| Specimen Item | No. 3-1 | No. 3-2 |
| --- | --- | --- |
| Crystal grain size | 2.1 μm | Epitaxial |
| H content | 3.7 atomic % | 0.5 atomic % |
| Hole Mobility | 1.1 cm$^2$/v.sec | 405 cm$^2$/v.sec |
| Conduction type | p type | p type |

TABLE 4

| Example | Raw material compound and flow rate | | Change of film forming condition | |
| --- | --- | --- | --- | --- |
| 4 | $Al(CH_3)_3$/He | 20 sccm | Microwave power | 250 W |
| | $SeH_2$(diluted with He to 500 ppm) | | H α/ H β = | 150 |
| | | 5 sccm | Constitution of the liberation nozzle in FIG. 2(b) (aperture: $\phi$ 2, interval decrease rate: 20%) | |
| | $A_5H_3$ | 15 sccm | | |
| | $H_2$/Ar | 20/150 sccm | | |
| 5 | $In(CH_3)_3$:$Zn(CH_3)_2$ | | Microwave power | 280 W |
| | = 10$^4$:1/He | 20 sccm | Pressure | 0.12 Torr |
| | $A_5H_3$ | 15 sccm | H α/ H β = | 45 |
| | $H_2$/Ar | 60/200 sccm | Substrate: p+-GaAs wafer | |
| 6 | $In(CH_3)_3$:$Te(CH_3)_2$ | | Microwave power | 300 W |
| | =10$^4$:1/He | 25 sccm | H α/ H β = | 180 |
| | $PF_5$ | 20 sccm | $In(CH_3)_3/Te(CH_3)_2$/He.$RF_5$ activated in activation chamber by RF glow discharge (100 W) and introduced | |
| | $H_2$ | 120 sccm | | |

TABLE 5

| Example | Film quality | Crystal grain size | H content | μe or μh | Conduction type |
| --- | --- | --- | --- | --- | --- |
| 4 | Al As:H:Se | 1.5 μm | 2.2 atomic | μe:22 cm$^2$/v.sec | n |

TABLE 5-continued

| Example | Film quality | Crystal grain size | H content | $\mu e$ or $\mu h$ | Conduction type |
|---|---|---|---|---|---|
| 5 | In As:H:Zn | epitaxial | 0.06 atomic % | $\mu h$:450 cm²/v.sec | p |
| 6 | In P:H:Te | 2.8 μm | 3.3 atomic % | $\mu e$:650 cm²/v.sec | n |

What we claim is:

1. A process for the formation of a functional deposited film containing atoms belonging to the group III and V of the periodical table as the main constituent atoms by introducing, into a film forming space for forming a deposited film on a substrate disposed therein, a compound (1) and a compound (2) represented respectively by the following general formulae (I) and (II) as the film-forming raw material and, if required, a compound (3) containing an element capable of controlling valence electrons for the deposited film as the constituent element each in a gaseous state, or in a state where at least one of such compounds is previously activated in an activation space disposed separately from said film forming space, while forming hydrogen atoms in excited state which cause chemical reaction with at least one of said compounds (1), (2) and (3) in the gaseous state or in the activated state in an activation space different from said film forming space and introducing them into the film-forming space, thereby forming the functional deposited film on said substrate, wherein said hydrogen atoms in excited state are formed from a hydrogen gas or a gas mixture composed of a hydrogen gas and a rare gas by means of a microwave plasma generated in a plasma generation chamber disposed in a cavity resonator integrated with two impedance matching circuits in a microwave circuit and the excited state of the hydrogen atoms is controlled:

$$RnMm \qquad (I)$$

$$AaBb \qquad (II)$$

where m represents a positive integer equal to or multiple integer of the valence number for R, n represents a positive integer equal to or multiple integer of the valence number for M, M represents an element belonging to the group III of the periodical table, R represents a member selected from hydrogen (H), halogen (X) and hydrocarbon group, a represents a positive integer equal to or multiple integer of the valence number for B, b represents a positive integer equal to or multiple integer of the valence number for A and A represents an element belonging to the group V of the periodical table, B represents a member selected from hydrogen (H), halogen (X) and hydrocarbon group.

2. A process for the formation of a functional deposited film as defined in claim 1, wherein the excited state of the hydrogen atoms is controlled by measuring the emission intensity of $H_\alpha/H_\beta$ which is the excited state of hydrogen by means of emission spectraphotometry and controlling at least one of the parameters of the microwave power to be charged into the cavity resonator, impedance matching condition, hydrogen gas flow rate or flow rate of the gas mixture composed of hydrogen gas and rare gas and total pressure so as to attain a desired value for said intensity ratio.

3. A process for the formation of a functional deposited film as defined in claim 1 or 2, wherein the impedance matching circuit in the cavity resonator integrated with the two impedance matching circuits in the microwave circuit is restriction means disposed to a cavity length varying plunger or to the junction portion between the microwave guide tube and the cavity resonator, and the impedance matching condition is controlled by adjusting them.

4. A process for the formation of a functional deposited film as defined in claim 3, wherein the impedance matching circuit is the cavity resonance varying plunger and an E-H tuner or a three stub tuner.

5. A process for the formation of a functional deposited film as defined in claim 1, wherein the plasma generation chamber comprises a metal mesh member and a microwave permeable bell jar and is connected by way of said metal mesh member to said film forming space.

6. A process for the formation of a functional deposited film as defined in claim 5, wherein the hydrogen atoms in the excited state are introduced through the metal mesh member into the film forming space.

7. A process for the formation of a functional deposited film as defined in claim 5, wherein the substrate is disposed at an angle of 30 degree or less relative to the horizontal axis of the metal mesh surface and at a distance within 100 mm from said metal mesh surface, and the compounds (1), (2) and (3) in the gaseous state or the activated state are introduced from the gas liberation means disposed between said metal mesh surface and said substrate into the film forming space.

8. A process for the formation of a functional deposited film as defined in claim 7, wherein the gas liberation means is disposed so as to surround the substrate in an annular manner, the interval of the gas liberation apertures is gradually decreased from the side of introducing the gas to the final liberation aperture of said gas liberation means, so that the gas liberation amount from the respective gas liberation apertures may be unified.

9. A process for the formation of a functional deposited film as defined in claim 7, wherein the gas liberation means is disposed so as to surround the substrate in an annular manner and the diameter for the gas liberation apertures is gradually increased from the side of introducing the gas to the final liberation aperture of said gas liberation means, so that the gas liberation amount from the respective gas liberation apertures may be unified.

10. A process for the formation of a functional deposited film as defined in claim 7, wherein the gas liberation apertures of the gas liberation means are uniformly distributed at least within the plane of the substrate and the aperture diameter for the respective gas liberation apertures is gradually increased from the side of introducing the gas to the central portion of the gas liberation means, so that the gas liberation amount from the respective gas liberation apertures may be unified.

* * * * *

UNITED STATES PATENT AND TRADEMARK OFFICE
CERTIFICATE OF CORRECTION

PATENT NO. : 4,914,052
DATED : April 3, 1990
INVENTOR(S) : MASAHIRO KANAI

Page 1 of 5

It is certified that error appears in the above-identified patent and that said Letters Patent is hereby corrected as shown below:

COLUMN 1

Line 12, "film)," should read --film"),--.
Line 49, "said" should be deleted.

COLUMN 2

Line 22, "film: the" should read --film. The--.
Line 29, "instable:" should read --instable,--.
Line 34, "diversed" should read --diverted--.

COLUMN 4

Line 17, "have" should read --has--.
Line 67, "A and A" should read --A, A--.

COLUMN 5

Line 3, "Method" should read --The method--.
Line 31, "is" should read --are--.
Line 41, "liberation aperture," should read
         --gas liberation aperture,--.
Line 43, "liberation" should read --gas liberation--.

COLUMN 6

Line 41, "take place" should read --which cause--.
Line 44, "has not" should read --do not have--.
Line 47, "dissociating" should read --to dissociate--.
Line 50, "they" should read --there--.
Line 53, "that" should be deleted.

UNITED STATES PATENT AND TRADEMARK OFFICE
CERTIFICATE OF CORRECTION

PATENT NO. : 4,914,052
DATED : April 3, 1990
INVENTOR(S) : MASAHIRO KANAI

It is certified that error appears in the above-identified patent and that said Letters Patent is hereby corrected as shown below:

COLUMN 7

Line 2, "belonging" should read --belonging to--.
Line 24, "As(CH$_3$)$_3$," (first occurrence) should be deleted.
Line 29, "material" should read --materials--.
Line 45, "ontaining" should read --containing--.

COLUMN 9

Line 34, "plasma forming" should read --plasma generation--.
Line 60, "collided" should read --collide--.
Lines 61, "gas introduction pipe" should read --gas supply pipe--.

COLUMN 10

Line 38, "wave guide tube" should read --waveguide tube--.

COLUMN 11

Line 32, "prising" should read --prises-- and "comprising" should read --comprises--.
Line 55, "30 degree" should read --30 degrees--.

UNITED STATES PATENT AND TRADEMARK OFFICE
CERTIFICATE OF CORRECTION

PATENT NO. : 4,914,052
DATED : April 3, 1990
INVENTOR(S) : MASAHIRO KANAI

It is certified that error appears in the above-identified patent and that said Letters Patent is hereby corrected as shown below:

COLUMN 12

Line 28, "30 degree" should read --30 degrees--.
    Line 29, "degree" should read --degrees--.
    Line 33, "compound" should read --compounds--.
    Line 44, "apertures" should read --aperture--.

COLUMN 14

Line 46, "resonance length" should read --cavity length--.
    Line 48, "circuits" should read --circuits.--.
    Line 52, "left" should read --left of--.
    Line 54, "slindingly" should read --slidingly--.

COLUMN 15

Line 24, "monitor" should read --monitoring--.
    Line 30, "monitor" should read --monitoring--.
    Line 43, "Coning Glass" should read --Corning Glass--.
    Line 68, "was" should read --were--.

COLUMN 16

Line 5, "reflection power-incident" should read --reflection power/incident--.
    Line 11, "the port 111" should read --the port 121--.
    Line 13, "distnce" should read --distance--.

UNITED STATES PATENT AND TRADEMARK OFFICE
CERTIFICATE OF CORRECTION

PATENT NO. : 4,914,052
DATED : April 3, 1990
INVENTOR(S) : MASAHIRO KANAI

It is certified that error appears in the above-identified patent and that said Letters Patent is hereby corrected as shown below:

COLUMN 16

Line 33, "to from" should read --to form--.
    Line 46, "diffractiometry" should read --diffractometry-- and "diffractiome-" should read --diffractome- --.

COLUMN 17

Line 1, "thermovoltatic" should read --thermovoltaic--.
    Line 3, "foregoings," should read --foregoing,--.
    Line 8, "Tow" should read --Two--.

Line 17, "and" (first occurrence) should be deleted.
    Line 29, "foregoings," should read --foregoing,--.
    Line 38, "gas supply pipe 120°" should read --gas supply pipe 120--.

COLUMN 18

Line 22, "confirmes" should read --confirmed--.
    Line 25, "thermovoltatic" should read --thermovoltaic--.

COLUMN 19

Line 15, "group" should read --groups--.
    Line 16, "periodical table" should read --periodic table--.
    Line 55, "A and A" should read --A, A--.
    Line 63, "spectraphotometry" should read --spectrophotometry--.

UNITED STATES PATENT AND TRADEMARK OFFICE
CERTIFICATE OF CORRECTION

PATENT NO. : 4,914,052
DATED : April 3, 1990
INVENTOR(S) : MASAHIRO KANAI

Page 5 of 5

It is certified that error appears in the above-identified patent and that said Letters Patent is hereby corrected as shown below:

COLUMN 20

Line 31, "30 degree" should read --30 degrees--.

Signed and Sealed this

Twenty-sixth Day of November, 1991

Attest:

HARRY F. MANBECK, JR.

Attesting Officer

Commissioner of Patents and Trademarks